United States Patent
Komura et al.

(10) Patent No.: US 11,195,992 B2
(45) Date of Patent: Dec. 7, 2021

(54) SPIN-ORBIT TORQUE TYPE MAGNETIZATION ROTATIONAL ELEMENT, SPIN-ORBIT TORQUE TYPE MAGNETORESISTANCE EFFECT ELEMENT, AND MAGNETIC MEMORY

(71) Applicant: TDK CORPORATION, Tokyo (JP)

(72) Inventors: Eiji Komura, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 31 days.

(21) Appl. No.: 16/625,449

(22) PCT Filed: Jan. 9, 2019

(86) PCT No.: PCT/JP2019/000312
§ 371 (c)(1),
(2) Date: Dec. 20, 2019

(87) PCT Pub. No.: WO2019/139025
PCT Pub. Date: Jul. 18, 2019

(65) Prior Publication Data
US 2021/0151665 A1 May 20, 2021

(30) Foreign Application Priority Data
Jan. 10, 2018 (JP) .............................. JP2018-002187

(51) Int. Cl.
*G11C 11/00* (2006.01)
*H01L 43/08* (2006.01)
(Continued)

(52) U.S. Cl.
CPC ............ *H01L 43/08* (2013.01); *G01R 33/093* (2013.01); *G11C 11/161* (2013.01);
(Continued)

(58) Field of Classification Search
CPC . G11C 11/161; G11C 11/1675; H01L 27/222; H01L 43/04; H01L 43/10
See application file for complete search history.

(56) References Cited

U.S. PATENT DOCUMENTS 8,350,347 B2  1/2013 Gaudin et al.
8,686,520 B2 * 4/2014 Worledge ................ H01L 43/04
                                                257/421
(Continued)

FOREIGN PATENT DOCUMENTS

WO   2016/021468 A1   2/2016

OTHER PUBLICATIONS

Miron et al.; "Perpendicular switching of a single ferromagnetic layer induced by in-plane current injection;" Nature; 2011; pp. 189-194; vol. 476.
(Continued)

*Primary Examiner* — Pho M Luu
(74) *Attorney, Agent, or Firm* — Oliff PLC

(57) ABSTRACT

A spin-orbit torque type magnetization rotational element includes; a spin-orbit torque wiring that extends in a first direction; a first ferromagnetic layer that is laminated in a second direction intersecting the spin-orbit torque wiring; and a first nonmagnetic metal layer and a second nonmagnetic metal layer that are connected to the spin-orbit torque wiring at positions flanking the first ferromagnetic layer in the first direction in a plan view from the second direction, wherein the gravity center of the first ferromagnetic layer is positioned on a side closer to the first nonmagnetic metal layer or the second nonmagnetic metal layer than is a reference point located at the center between the first and second nonmagnetic metal layers in the first direction.

15 Claims, 11 Drawing Sheets

(51) Int. Cl.
*G01R 33/09* (2006.01)
*G11C 11/16* (2006.01)
*H01L 27/22* (2006.01)
*H01L 43/04* (2006.01)
*H01L 43/10* (2006.01)

(52) U.S. Cl.
CPC ........ *G11C 11/1675* (2013.01); *H01L 27/222* (2013.01); *H01L 43/04* (2013.01); *H01L 43/10* (2013.01)

(56) References Cited

U.S. PATENT DOCUMENTS

| | | | | |
|---|---|---|---|---|
| 9,391,262 | B1 | 7/2016 | Nikonov et al. | |
| 9,830,966 | B2* | 11/2017 | Mihajlovic | H01L 43/10 |
| 10,229,723 | B1* | 3/2019 | Choi | G11C 11/16 |
| 10,586,580 | B2* | 3/2020 | Honjo | H01L 27/228 |
| 2015/0348606 | A1 | 12/2015 | Buhrman et al. | |
| 2017/0222135 | A1 | 8/2017 | Fukami et al. | |

OTHER PUBLICATIONS

Kato et al.; "Observation of the Spin Hall Effect in Semiconductors;" Science; 2004; pp. 1910-1913; vol. 306.

Liu et al.; "Spin torque switching with the giant spin Hall effect of tantalum;" Science; 2012; pp. 555-586; vol. 336.

Liu et al.; "Current-Induced Switching of Perpendicularly Magnetized Magnetic Layers Using Spin Torque from the Spin Hall Effect;" Physical Review Letters; 2012; pp. 096602-1-096602-5; vol. 109, No. 9.

Lee et al.; "Threshold current for switching of a perpendicular magnetic layer induced by spin Hall effect;" Applied Physics Letters; 2013; 18pp; vol. 102.

Lee et al.; "Thermally activated switching of perpendicular magnet by spin-orbit spin torque;" Applied Physics Letters; 2014; pp. 072413-1-072413-5; vol. 104.

Fukami et al.; "Magnetization switching by spin-orbit torque in an antiferromagnet-ferromagnet bilayer system;" Nature Materials; 2016; pp. 535-542; vol. 15.

Fukami et al.; "A spin-orbit torque switching scheme with collinear magnetic easy axis and current configuration;" Nature Nanotechnology; 2016; pp. 621-626; vol. 11.

Takahashi et al.; "Spin injection and detection in magnetic nanostructures;" Physical Review B; pp. 052409-1-052409-4; vol. 67.

Seo et al.; "Area-Efficient SOT-MRAM With a Schottky Diode;" IEEE Electron Device Letters; 2016; pp. 982-985; vol. 37, No. 8.

Apr. 2, 2019 Search Report issued in International Patent Application No. PCT/JP2019/000312.

* cited by examiner

SPIN-ORBIT TORQUE TYPE MAGNETIZATION ROTATIONAL ELEMENT, SPIN-ORBIT TORQUE TYPE MAGNETORESISTANCE EFFECT ELEMENT, AND MAGNETIC MEMORY

CROSS-REFERENCE TO RELATED APPLICATION

This application is based upon and claims the benefit of priority from Japanese Patent Application No. 2018-002187, Jan. 10, 2018; the entire contents of which are incorporated herein by reference.

TECHNICAL FIELD

The present invention relates to a spin-orbit torque type magnetization rotational element, a spin-orbit torque type magnetoresistance effect element, and a magnetic memory. Priority is claimed on Japanese Patent Application No. 2018-002187, filed Jan. 10, 2018 in Japan, the content of which is incorporated herein by reference.

BACKGROUND ART

Giant magnetoresistance (GMR) elements configured of a multilayer film including a ferromagnetic layer and a nonmagnetic layer and tunnel magnetoresistance (TMR) elements using an insulating layer (a tunnel barrier layer or a barrier layer) as the nonmagnetic layer are known. These have attracted attention as elements for magnetic sensors, high-frequency components, magnetic heads, and nonvolatile random access memories (MRAM).

An MRAM reads and writes data using a characteristic that an element resistance of a GMR element or a TMR element changes when magnetization directions of two ferromagnetic layers sandwiching an insulating layer change. As a writing method of an MRAM, a method of writing (magnetization reversal) using a magnetic field generated by a current, and a method of writing (magnetization reversal) using a spin transfer torque (STT) generated by a current flowing in a stacking direction of a magnetoresistance effect element are known.

In magnetization reversal of a magnetoresistance effect element using an STT, it is necessary for a current to flow in a stacking direction of a magnetoresistance effect element when data is written. A writing current may degrade characteristics of the magnetoresistance effect element.

Therefore, in recent years, attention has been focused on methods that do not require a current to flow in the stacking direction of a magnetoresistance effect element during writing. One method is a writing method using a spin-orbit torque (SOT) (for example, Non-Patent Document 1). An SOT is induced by a pure spin current generated by spin-orbit interaction or a Rashba effect at an interface between different materials. A current for inducing an SOT in a magnetoresistance effect element flows in a direction intersecting the stacking direction of the magnetoresistance effect element. A writing method using an SOT does not require a current to flow in the stacking direction of a magnetoresistance effect element, and a longer lifespan for a magnetoresistance effect element is expected to be able to be achieved therewith.

CITATION LIST

Non-Patent Literature

Non-Patent Document 1

I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Technical Problem

When a current passes through a predetermined spin-orbit torque wiring containing heavy metals or the like, many spins are injected into a ferromagnetic material, so that a large SOT is induced in the ferromagnetic material. On the other hand, a spin-orbit torque wiring is inferior in thermal conductivity as compared to copper wiring, aluminum wiring, and the like that are generally used for wiring. When a current is applied to a spin-orbit torque wiring, a temperature of a ferromagnetic material connected to the spin-orbit torque wiring increases, and thus a stability of magnetization of the ferromagnetic material decreases. The decrease of the stability of magnetization of the ferromagnetic material may cause a write error in a magnetoresistance effect element.

The present invention has been realized in view of the above circumstances, and provides a spin-orbit torque type magnetization rotational element that has excellent heat exhaustion properties.

Solution to Problem

As a result of intensive studies, the present inventors have found a configuration of an element that has excellent heat exhaustion properties. That is, the present invention provides the following means in order to solve the above problems.

(1) A spin-orbit torque type magnetization rotational element according to a first aspect includes a spin-orbit torque wiring extending in a first direction, a first ferromagnetic layer laminated in a second direction intersecting the spin-orbit torque wiring, and a first nonmagnetic metal layer and a second nonmagnetic metal layer which are connected to the spin-orbit torque wiring at positions sandwiching the first ferromagnetic layer in the first direction in a plan view seen in the second direction, in which, in the first direction, a center of gravity of the first ferromagnetic layer is positioned on either a first nonmagnetic metal layer side or a second nonmagnetic metal layer side from a reference point that is a center between the first nonmagnetic metal layer and the second nonmagnetic metal layer.

(2) The spin-orbit torque type magnetization rotational element according to the above aspect may be configured such that the center of gravity is positioned on the second nonmagnetic metal layer side deviating from the reference point, and the second nonmagnetic metal layer is positioned downstream when a current is applied to the spin-orbit torque wiring.

(3) In the spin-orbit torque type magnetization rotational element according to the above aspects, a portion of the first ferromagnetic layer may overlap the reference point in a plan view seen in the second direction.

(4) In the spin-orbit torque type magnetization rotational element according to the above aspects, the first nonmagnetic metal layer may be positioned upstream when a current is applied to the spin-orbit torque wiring and has a first end portion on a first ferromagnetic layer side, and a distance D in the first direction between the first end portion and the center of gravity and a thickness $T_2$ of the spin-orbit torque wiring may satisfy the relationship of $6 \leq D/T_2 \leq 56$.

(5) In the spin-orbit torque type magnetization rotational element according to the above aspects, widths of the first nonmagnetic metal layer and the second nonmagnetic metal layer may be wider than a width of the first ferromagnetic layer.

(6) In the spin-orbit torque type magnetization rotational element according to the above aspects, the thicknesses of the first nonmagnetic metal layer and the second nonmagnetic metal layer may be thicker than the thickness of the spin-orbit torque wiring, and widths of the first nonmagnetic metal layer and the second nonmagnetic metal layer may be wider than a width of the spin-orbit torque wiring.

(7) In the spin-orbit torque type magnetization rotational element according to the above aspects, the first nonmagnetic metal layer and the second nonmagnetic metal layer may include any one of a group consisting of Ag, Au, Cu, Al, W, Co, Ni, Zn, Ta, TiN, and TaN.

(8) In the spin-orbit torque type magnetization rotational element according to the above aspects, the first nonmagnetic metal layer and the second nonmagnetic metal layer may be connected to a second surface on a side opposite to a first surface facing the first ferromagnetic layer of the spin-orbit torque wiring.

(9) In the spin-orbit torque type magnetization rotational element according to the above aspects, the first nonmagnetic metal layer and the second nonmagnetic metal layer may be connected to a first surface facing the first ferromagnetic layer of the spin-orbit torque wiring.

(10) In the spin-orbit torque type magnetization rotational element according to the above aspects, the first nonmagnetic metal layer and the second nonmagnetic metal layer may be connected to the spin-orbit torque wiring without an intervening oxide.

(11) In the spin-orbit torque type magnetization rotational element according to the above aspects, a portion of the first ferromagnetic layer may overlap the first nonmagnetic metal layer or the second nonmagnetic metal layer in a plan view seen in the second direction.

(12) The spin-orbit torque type magnetization rotational element according to the above aspects may further include a control unit, which allows a read current to flow between the first nonmagnetic metal layer or the second nonmagnetic metal layer overlapping the portion of the first ferromagnetic layer and the first ferromagnetic layer in a plan view seen in the second direction.

(13) A spin-orbit torque magnetoresistance effect element according to the second aspect includes a spin-orbit torque type magnetization rotational element according to the above aspects, a nonmagnetic layer which is laminated on a fourth surface on a side opposite to the third surface facing the spin-orbit torque wiring in the first ferromagnetic layer, and a second ferromagnetic layer sandwiching the nonmagnetic layer together with the first ferromagnetic layer.

(14) A magnetic memory according to a third aspect includes a plurality of spin-orbit torque type magnetoresistance effect elements according to the above aspects.

Advantageous Effects of Invention

It is possible to provide a spin-orbit torque type magnetic rotational element with excellent heat exhaustion properties.

DESCRIPTION OF EMBODIMENTS

Figure 1:
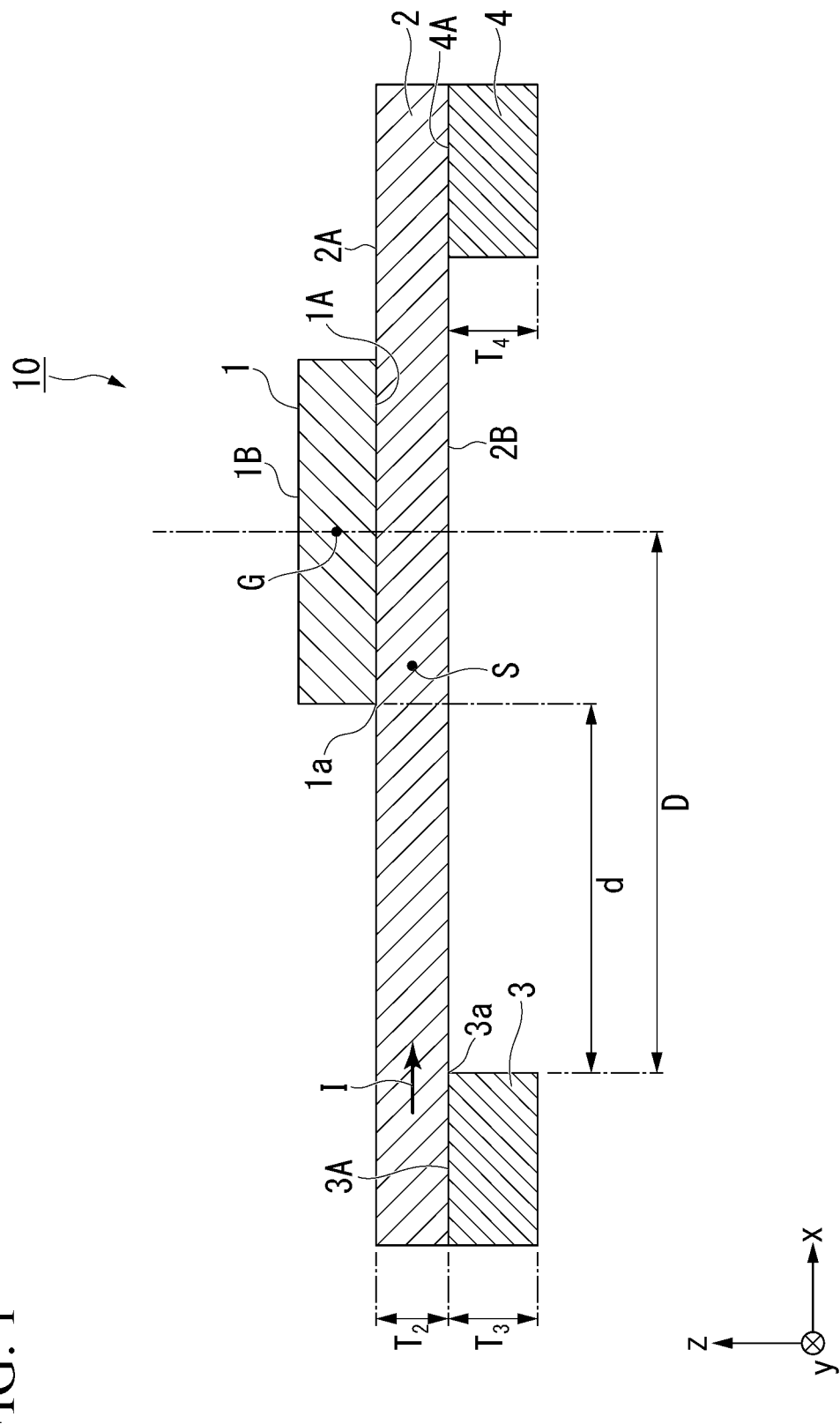
FIG. 1 is a schematic cross-sectional view of a spin-orbit torque type magnetization rotational element according to a first embodiment.

Hereinafter, the present embodiment will be described in detail with reference to the drawings as appropriate. In the drawings used in the following description, in order to make features easier to understand, portions constituting the features may be shown in an enlarged manner for the sake of convenience, and dimensional proportions of the respective components may differ from actual ones. It should be understood that materials, dimensions, and the like exemplified in the following description are merely examples, and the present invention is not limited to these, and can be implemented with appropriate modifications within a scope in which the effects of the present invention can be achieved.

First Embodiment (Spin-Orbit Torque Type Magnetization Rotational Element)

Figure 2:
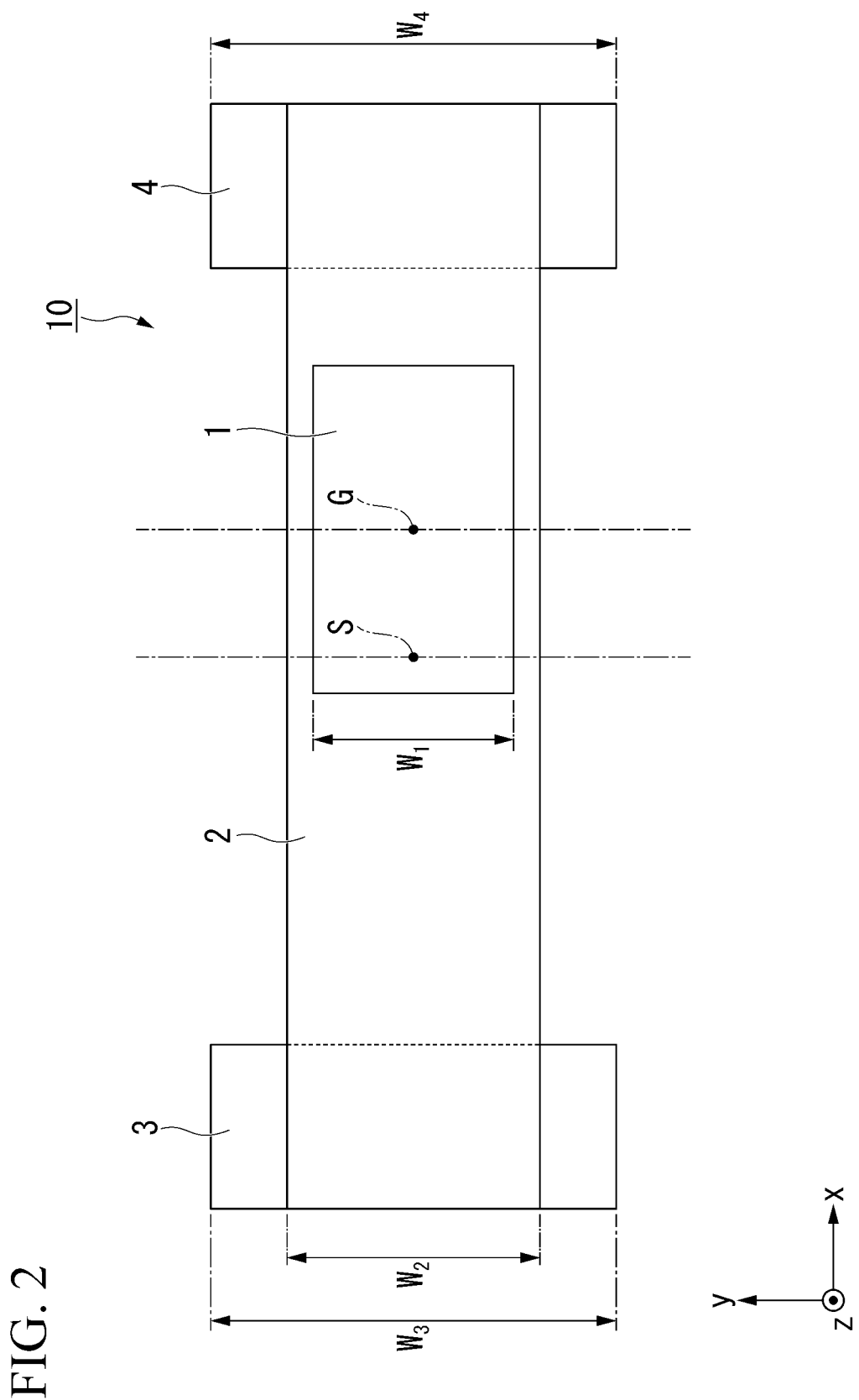
FIG. 2 is a schematic plan view of the spin-orbit torque type magnetization rotational element according to the first embodiment.

FIG. 1 is a schematic cross-sectional view of a spin-orbit torque type magnetization rotational element 10 according to the present embodiment, and FIG. 2 is a schematic plan view of the spin-orbit torque type magnetization rotational element 10 according to the present embodiment. The spin-orbit torque type magnetization rotational element 10 includes a first ferromagnetic layer 1, a spin-orbit torque wiring 2, a first nonmagnetic metal layer 3, and a second nonmagnetic metal layer 4. FIG. 2 is a plan view seen in a z direction, and shows a surface of each layer on +z side.

Hereinafter, the present embodiment will be explained on the basis of defining a first direction in which the spin-orbit torque wiring 2 extends as an x direction, a laminating direction (a second direction) of the first ferromagnetic layer 1 as the z direction, and a direction orthogonal to both the x direction and the z direction as a y direction.

<Spin-Orbit Torque Wiring>

The spin-orbit torque wiring 2 extends in the x direction. The spin-orbit torque wiring 2 has a first surface 2A and a second surface 2B. The first surface 2A faces a third surface 1A of the first ferromagnetic layer 1. Here, to "face" means a relationship of facing each other, in which two layers may be in contact with each other or may have another layer therebetween. The spin-orbit torque wiring 2 in FIG. 1 is directly connected to one surface of the first ferromagnetic layer 1 in the z direction. The spin-orbit torque wiring 2 may be directly connected to the first ferromagnetic layer 1 or may be connected thereto via another layer.

The spin-orbit torque wiring 2 is made of a material that generates a spin current due to the spin Hall effect when a current I flows. As such a material, any material that can generate a spin current in the spin-orbit torque wiring 2 is sufficient. Therefore, the material is not limited to a material composed of a single element and may be configured of a portion composed of a material that easily generates a spin current and a portion composed of a material with which it is difficult to generate a spin current.

The spin Hall effect is a phenomenon in which a spin current is induced in a direction orthogonal to a direction of a current I on the basis of a spin-orbit interaction when the current I flows through a wiring. The mechanism by which a spin current is generated by the spin Hall effect will be described.

When a potential difference is applied to both ends of the spin-orbit torque wiring 2, the current I flows along the spin-orbit torque wiring 2. When the current I flows, a first spin S1 oriented in one direction and a second spin S2 oriented in a direction opposite to the first spin S1 are respectively bent in directions orthogonal to the current. For example, the first spin S1 is bent in the z direction with respect to a traveling direction, and the second spin S2 is bent in the −z direction with respect to the traveling direction.

The normal Hall effect and the spin Hall effect are the same in that a moving (traveling) charge (electrons) can bend the moving (traveling) direction. On the other hand, they are greatly different from each other in that, in the normal Hall effect, charged particles moving in a magnetic field receive a Lorentz force and bend a direction of movement, whereas in the spin Hall effect, even in the absence of a magnetic field, traveling directions of the spins are bent only by movement of electrons (only a current flows).

In a nonmagnetic material (a material that is not a ferromagnetic material), the number of electrons of the first spin S1 is equal to the number of electrons of the second spin S2. Due to the spin Hall effect, the number of electrons of the first spin S1 directed in the +z direction is equal to the number of electrons of the second spin S2 directed in the −z direction in the figure. In this case, flows of charges cancel each other out, and thus an amount of current becomes zero. A spin current without an electric current is particularly called a pure spin current.

When a flow of electrons of the first spin S1 is $J_\uparrow$, a flow of electrons of the second spin S2 is $J_\downarrow$, and a spin current is $J_S$, the spin current is defined as $J_S = J_\uparrow - J_\downarrow$. The spin current $J_S$ flows in the z direction in the figure. In FIG. 1, there is the first ferromagnetic layer 1, which will be described later, on an upper surface of the spin-orbit torque wiring 2. For this reason, the spin is injected into the first ferromagnetic layer 1.

The spin-orbit torque wiring 2 is made of any one of a metal, an alloy, an intermetallic compound, a metal boride, a metal carbide, a metal silicide, and a metal phosphide having a function of generating a spin current by the spin Hall effect when a current flows.

A main component of the spin-orbit torque wiring 2 is preferably a nonmagnetic heavy metal. Here, the heavy metal means a metal having a specific gravity equal to or higher than that of yttrium. A nonmagnetic heavy metal is preferably a nonmagnetic metal having a large atomic number of 39 or more having d electrons or f electrons in the outermost shell. These nonmagnetic metals have a large spin-orbit interaction that causes the spin Hall effect.

Electrons generally move in a direction opposite to a current regardless of their spin directions. On the other hand, nonmagnetic metals having a large atomic number having d electrons or f electrons in the outermost shell have a large spin-orbit interaction and a strong spin Hall effect. For this reason, a direction in which electrons move depends on directions of spins of electrons. Therefore, a spin current is easily occurs in these nonmagnetic heavy metals.

Also, the spin-orbit torque wiring 2 may include a magnetic metal. The magnetic metal refers to a ferromagnetic metal or an antiferromagnetic metal. If a nonmagnetic metal contains a minute amount of a magnetic metal, it becomes a cause of spin scattering. When spins are scattered, the spin-orbit interaction is enhanced, and thus a generation efficiency of the spin current with respect to the current is increased. A main component of the spin-orbit torque wiring 2 may be composed only of an antiferromagnetic metal.

On the other hand, if an amount of the magnetic metal added is increased too much, the generated spin current is scattered by the added magnetic metal, and as a result, an action of reducing the spin current may become stronger. Therefore, a molar ratio of the added magnetic metal is preferably sufficiently smaller than a total of molar ratios of elements constituting the spin-orbit torque wiring. The molar ratio of the magnetic metal to be added is preferably 3% or less of the whole.

The spin-orbit torque wiring 2 may include a topological insulator. A topological insulator is a substance in which the inside of the substance is an insulator or a high-resistance substance, but a spin-polarized metal state is generated on a surface thereof. An internal magnetic field due to a spin-orbit interaction is generated in the substance. Therefore, even without an external magnetic field, a new topological phase appears due to the effect of spin-orbit interaction. This is a topological insulator, and a pure spin current can be generated with high efficiency due to a strong spin-orbit interaction and by breaking an inversion symmetry at an edge thereof.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are preferable. These topological insulators can generate a spin current with high efficiency.

<First Ferromagnetic Layer>

The first ferromagnetic layer 1 is laminated in the second direction (z direction) intersecting the spin-orbit torque wiring 2. The first ferromagnetic layer 1 has the third surface 1A and a fourth surface 1B. The third surface 1A faces the first surface 2A of the spin-orbit torque wiring 2. The fourth surface 1B is a surface opposite to the third surface 1A in the first ferromagnetic layer 1. The first ferromagnetic layer 1 functions by changing its magnetization direction. The first ferromagnetic layer 1 may be an in-plane magnetization film having a direction of easy magnetization in an x-y plane or a vertical magnetization film having an axis of easy magnetization in the z direction.

A ferromagnetic material, in particular, a soft magnetic material can be applied to the first ferromagnetic layer 1. For example, a metal selected from the group consisting of Cr, Mn, Co, Fe, and Ni, an alloy containing one or more of these metals, an alloy containing these metals and at least one or more elements from B, C, and N can be used. Specifically, Co—Fe, Co—Fe—B, and Ni—Fe are exemplary examples.

Also, when the first ferromagnetic layer 1 is an in-plane magnetization film, for example, a Co—Ho alloy ($CoHo_2$), an Sm—Fe alloy ($SmFe_{12}$), or the like is preferably used.

The first ferromagnetic layer 1 may be a Heusler alloy. A Heusler alloy is a half metal and has a high spin polarizability. Heusler alloys include intermetallic compounds having a chemical composition of XYZ or $X_2YZ$. X is a transition metal element or a noble metal element of the Co, Fe, Ni, or Cu groups in the periodic table. Y is a transition metal of the Mn, V, Cr, or Ti groups, or the same types of element as for X. Z is a typical element of Group III to Group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, etc., are examples of Heusler alloys.

<First Nonmagnetic Metal Layer and Second Nonmagnetic Metal Layer>

The first nonmagnetic metal layer 3 and the second nonmagnetic metal layer 4 are desposed at positions sandwiching the first ferromagnetic layer 1 in a plan view seen in the z direction. By applying a potential difference between the first nonmagnetic metal layer 3 and the second nonmagnetic metal layer 4, a current I flows in the spin-orbit torque wiring 2. The first nonmagnetic metal layer 3 and the second nonmagnetic metal layer 4 function as electrodes for flowing the current I through the spin-orbit torque wiring 2. The first nonmagnetic metal layer 3 is electrically connected to, for example, an external power source. The second nonmagnetic metal layer 4 is electrically connected to, for example, an external reference potential. The current I flows on the basis of a potential difference between the external power source and the reference potential. For example, when the current I is applied to the spin-orbit torque wiring 2, the first nonmagnetic metal layer 3 is at a position that becomes an upstream side (a side opposite to the reference potential) in a flowing direction of the current I. For example, when the current I is applied to the spin-orbit torque wiring 2, the second nonmagnetic metal layer 4 is at a position that becomes a downstream side (a reference potential side) in the flowing direction of the current I. For example, when the second nonmagnetic metal layer 4 is connected to the ground, the ground becomes the reference potential.

The first nonmagnetic metal layer 3 and the second nonmagnetic metal layer 4 preferably include any one of the group consisting of Ag, Au, Cu, Al, W, Co, Ni, Zn, Ta, TiN and TaN. These materials have an excellent thermal conductivity and can efficiently exhaust heat accumulated in the spin-orbit torque wiring 2.

It is preferable that the first nonmagnetic metal layer 3 and the second nonmagnetic metal layer 4 be directly connected to the spin-orbit torque wiring 2 without an intervening oxide that hinders heat conduction.

<Relationship Between Respective Components>

In the x direction, a center of gravity G of the first ferromagnetic layer 1 is positioned at a position deviating toward either the first nonmagnetic metal layer 3 or the second nonmagnetic metal layer 4 from a reference point S that is a center between the first nonmagnetic metal layer 3 and the second nonmagnetic metal layer 4. The reference point S is a center of a line segment that connects a center of gravity of the first nonmagnetic metal layer 3 and a center of gravity of the second nonmagnetic metal layer 4. When the first ferromagnetic layer 1, the first nonmagnetic metal layer 3, and the second nonmagnetic metal layer 4 form a shape that is line-symmetric or point-symmetric in the x direction in a plan view seen in the z direction, positions of their centers and positions of their centers of gravity often coincide with each other, respectively. For that reason, the positions of the centers of the first ferromagnetic layer 1, the first nonmagnetic metal layer 3, and the second nonmagnetic metal layer 4 in the x direction can be respectively regarded as the positions of the centers of gravity of the first ferromagnetic layer 1, the first nonmagnetic metal layer 3, and the second nonmagnetic metal layer 4 in the x direction. That is, it can be said in other words such that, in the x direction, the center of the first ferromagnetic layer 1 is positioned at a position deviating toward either the first nonmagnetic metal layer 3 or the second nonmagnetic metal layer 4 from the reference point S that is the center between the first nonmagnetic metal layer 3 and the second nonmagnetic metal layer 4.

Much of the heat accumulated in the spin-orbit torque wiring 2 is exhausted from the first nonmagnetic metal layer 3 and the second nonmagnetic metal layer 4. For that reason, the reference point S of the spin-orbit torque wiring 2 has the highest temperature in the spin-orbit torque wiring 2, and the temperature decreases as going away from the reference point S in the x direction. When the position of the center of gravity G of the first ferromagnetic layer 1 and the reference point S in the x direction overlap, magnetization of the first ferromagnetic layer 1 is easily affected by heat, and thus an unintended magnetization reversal due to the heat easily occurs.

On the other hand, if the positions of the center of gravity G of the first ferromagnetic layer 1 and the reference point S in the x direction deviate from each other, the center of gravity G of the first ferromagnetic layer 1 can be shifted from the highest temperature position. That is, it is possible to prevent the magnetization of the first ferromagnetic layer 1 from causing an unintended magnetization reversal due to heat.

The center of gravity G of the first ferromagnetic layer 1 is preferably separated from the reference point S by 15% or more of the distance between the first nonmagnetic metal layer 3 and the second nonmagnetic metal layer 4, and more preferably separated from the reference point S by 25% or more. The distance between the first nonmagnetic metal layer 3 and the second nonmagnetic metal layer 4 is a length of the perpendicular to an imaginary line extending in the y direction from the center of gravity of the first nonmagnetic metal layer 3 through the center of gravity of the second nonmagnetic metal layer 4. The center of gravity G of the first ferromagnetic layer 1 is preferably separated away from the reference point S by 15 nm or more, and more preferably separated by 25 nm or more.

Although the center of gravity G of the first ferromagnetic layer 1 may be positioned on the first nonmagnetic metal layer 3 side or on the second nonmagnetic metal layer 4 side while deviating from the reference point S, it is preferably positioned on the second nonmagnetic metal layer 4 side, which is positioned downstream in the flowing direction of the current I, as shown in FIG. 1.

The current I flows from the first nonmagnetic metal layer 3 to the spin-orbit torque wiring 2. The vicinity of an interface between different substances is easily affected by a contact resistance and the like. That is, a flow of the current I tends to be unstable in the vicinity of the interface between the first nonmagnetic metal layer 3 and the spin-orbit torque wiring 2. When the center of gravity G of the first ferromagnetic layer 1 is positioned downstream in the flowing direction of the current I, the current I that flows in the spin-orbit torque wiring 2 is stabilized when it reaches the first ferromagnetic layer 1. When the current I is stabilized, an amount of spin injected into the first ferromagnetic layer 1 is stabilized by the spin Hall effect, and a magnetization reversal of the first ferromagnetic layer 1 is stabilized.

Further, the distance D in the x direction between a first end portion 3a of the first nonmagnetic metal layer 3 on the first ferromagnetic layer 1 side and the center of gravity G and the thickness $T_2$ of the spin-orbit torque wiring 2 preferably satisfy the relationship of $6 \le D/T_2 \le 56$, and more preferably satisfy the relationship of $10 \le D/T_2 \le 34$. Here, the first end portion 3a is an end portion on the first ferromagnetic layer 1 side of a contact surface between the spin-orbit torque wiring 2 and the first nonmagnetic metal layer 3 in a cross section passing through a center of the spin-orbit torque wiring 2 in a width direction (y direction). The thickness $T_2$ of the spin-orbit torque wiring 2 is an average thickness of the spin-orbit torque wiring 2.

When the thickness $T_2$ of the spin-orbit torque wiring 2 varies, a current density of the current I changes. If the current density of the current I varies, a distance required until the current I stabilizes changes. By satisfying the above relational equations, it is possible to stabilize the amount of spin injected into the first ferromagnetic layer 1 due to the spin Hall effect.

A distance d in the x direction between the first end portion 3a and an end portion 1a of the first ferromagnetic layer 1 on the first nonmagnetic metal layer 3 side and the thickness $T_2$ of the spin-orbit torque wiring 2 preferably satisfy the relationship of $3 \le d/T_2 \le 23$, and more preferably satisfy the relationship of $5 \le d/T_2 \le 15$. The end portion 1a is an end portion positioned closest to the first nonmagnetic metal layer 3 in the first ferromagnetic layer 1 in a cross section passing through the center of the spin-orbit torque wiring 2 in the width direction (y direction). When the first end portion 3a and the end portion 1a satisfy the above relationship, the current I is stabilized when it reaches the first ferromagnetic layer 1.

The thickness $T_2$ of the spin-orbit torque wiring 2 is, for example, preferably 1 nm or more and 15 nm or less, more preferably 2 nm or more and 10 nm or less, and further preferably 3 nm or more and 5 nm or less.

The distance D between the first end portion 3a and the center of gravity G is, for example, preferably 10 nm or more and 150 nm or less, more preferably 15 nm or more and 100 nm or less, and further preferably 20 nm or more and 75 nm or less.

The distance d between the first end portion 3a and the end portion 1a is, for example, preferably 15 nm or more and 100 nm or less, more preferably 20 nm or more and 75 nm or less, and further preferably 25 nm or more and 50 nm or less.

As shown in FIGS. 1 and 2, it is preferable that a portion of the first ferromagnetic layer 1 overlap the reference point S in a plan view seen in the z direction. In the present specification, "in a plan view seen in the z direction" refers to the widest region occupied by each layer when viewed in the z direction. When an area of the third surface 1A of the first ferromagnetic layer 1 is larger than an area of the fourth surface 1B of the first ferromagnetic layer 1 (For example, a cross section of the first ferromagnetic layer 1 is a trapezoid having a top bottom in the +z direction), the third surface 1A becomes a reference for overlapping the reference point S. The reference point S and the first ferromagnetic layer 1 partially overlap in a plan view seen in the z direction in a state where the center of gravity G of the first ferromagnetic layer 1 is at a position deviating from the reference point S, a volume of the first ferromagnetic layer 1 increases. As the volume of the first ferromagnetic layer 1 increases, a magnetic strength of the entire first ferromagnetic layer 1 increases, and thus the stability of magnetization increases. Further, when data is written, heat generated in the spin-orbit torque wiring 2 can be used for magnetization reversal, and the magnetization reversal can be facilitated.

Here, it is also thought that the use of the heat generated in the spin-orbit torque wiring 2 for the magnetization reversal may lead to an erroneous writing due to the heat generated in the spin-orbit torque wiring 2. However, the positions of the reference point S generating the most heat and the center of gravity G deviate from each other, and the magnetic strength of the entire first ferromagnetic layer 1 is high, an influence of heat on the magnetization of the first ferromagnetic layer 1 is sufficiently inhibited. For that reason, heat cannot give the first ferromagnetic layer 1 enough energy for reaching an erroneous writing, but rather becomes a factor assisting the magnetization reversal.

The first ferromagnetic layer 1 preferably occupies 7% or more of an area of the spin-orbit torque wiring 2 in a plan view seen in the z direction, more preferably occupies 15% or more, further preferably occupies 30% or more, and yet further preferably occupies 50% or more. As described above, when the volume of the first ferromagnetic layer 1 increases, the magnetic strength of the entire first ferromagnetic layer 1 increases and thus the stability of magnetization is enhanced.

As shown in FIG. 1, a thickness $T_3$ of the first nonmagnetic metal layer 3 and a thickness $T_4$ of the second nonmagnetic metal layer 4 are preferably thicker than the thickness $T_2$ of the spin-orbit torque wiring 2, and preferably thicker twice or more the thickness $T_2$ of the spin-orbit torque wiring 2. Also, as shown in FIG. 2, a width $W_3$ of the first nonmagnetic metal layer 3 and a width $W_4$ of the second nonmagnetic metal layer 4 are preferably wider than a width $W_2$ of the spin-orbit torque wiring 2, and preferably wider twice or more the width $W_2$ of the spin-orbit torque wiring 2. By satisfying these relationships, heat capacities of the first nonmagnetic metal layer 3 and the second nonmagnetic metal layer 4 increase, and thus the amount of heat generated in the spin-orbit torque wiring 2 can be sufficiently exhausted. The thickness of each layer is an average thickness of each layer. The widths of the first nonmagnetic metal layer 3 and the second nonmagnetic metal layer 4 are the maximum values of the widths of the first nonmagnetic metal layer 3 and the second nonmagnetic metal layer 4 in the y direction on the first surfaces 3A and 4A of the first nonmagnetic metal layer 3 and the second nonmagnetic metal layer 4 on the spin-orbit torque wiring 2 side. The width of the spin-orbit torque wiring 2 is an average value of a width of the second surface 2B of the spin-orbit torque wiring 2 in the y direction at a position overlapping the first nonmagnetic metal layer 3 or the second nonmagnetic metal layer 4 in a plan view seen in the z direction.

The thickness $T_3$ of the first nonmagnetic metal layer 3 and the thickness $T_4$ of the second nonmagnetic metal layer 4 are preferably 10 nm or more and 100 nm or less, more preferably 15 nm or more and 75 nm or less, and further preferably 20 nm or more and 50 nm or less.

The width $W_3$ of the first nonmagnetic metal layer 3 and the width $W_4$ of the second nonmagnetic metal layer 4 are preferably 80 nm or more and 600 nm or less, more preferably 100 nm or more and 500 nm or less, and further preferably 120 nm or more and 400 nm or less.

Further, the width $W_2$ of the spin-orbit torque wiring 2 is preferably 40 nm or more and 300 nm or less, more preferably 50 nm or more and 250 nm or less, and further preferably 60 nm or more and 200 nm or less.

There are heat conduction, advection (convection), and heat radiation in a process of carrying heat. Although the present invention has mainly been explained on the basis of heat conduction as described above, considering effects of heat radiation, the widths $W_3$ and $W_4$ of the first nonmagnetic metal layer 3 and the second nonmagnetic metal layer 4 are preferably wider than the width Wi of the first ferromagnetic layer. When the spin-orbit torque wiring 2 generates heat, the first ferromagnetic layer 1 also generates heat. If the heat accumulated in the first ferromagnetic layer 1 is immediately radiated, an unintended magnetization reversal of the first ferromagnetic layer 1 due to heat can be prevented.

The heat accumulated in the first ferromagnetic layer 1 isotropically diffuses around the first ferromagnetic layer 1 due to heat radiation. When the widths $W_3$ and $W_4$ of the first nonmagnetic metal layer 3 and the second nonmagnetic metal layer 4 are wider than the width Wi of the first ferromagnetic layer 1, the first nonmagnetic metal layer 3 and the second nonmagnetic metal layer 4 can receive much of the heat spreading from the first ferromagnetic layer 1. The heat received by the first nonmagnetic metal layer 3 and the second nonmagnetic metal layer 4 is quickly exhausted by the first nonmagnetic metal layer 3 and the second nonmagnetic metal layer 4 which have excellent thermal conductivity. As a result, the heat radiation from the first ferromagnetic layer 1 proceeds promptly, and thus an unintended magnetization reversal of the first ferromagnetic layer 1 due to heat can be prevented. The width of the first ferromagnetic layer 1 is a width of the third surface 1A in the y direction at the center of the first ferromagnetic layer 1 in the x direction.

The width Wi of the first ferromagnetic layer 1 is preferably 10 nm or more and 200 nm or less, more preferably 20 nm or more and 100 nm or less, and further preferably 25 nm or more and 80 nm or less.

The width $W_1$ of the first ferromagnetic layer 1 is preferably narrower than the width $W_2$ of the spin-orbit torque wiring 2. The spin that causes SOT is supplied from the spin-orbit torque wiring 2. By satisfying this relationship, an in-plane magnetic variation of the first ferromagnetic layer 1 can be inhibited.

In the spin-orbit torque type magnetization rotational element 10 shown in FIG. 1, the first nonmagnetic metal layer 3 and the second nonmagnetic metal layer 4 are connected to the second surface 2B on a side opposite to the first surface 2A facing the first ferromagnetic layer 1 of the spin-orbit torque wiring 2. In the case of the above configuration, wirings connected to the first nonmagnetic metal layer 3 and the second nonmagnetic metal layer 4 can be easily routed, and thus the spin-orbit torque type magnetization rotational element 10 can be easily manufactured.

Figure 3:
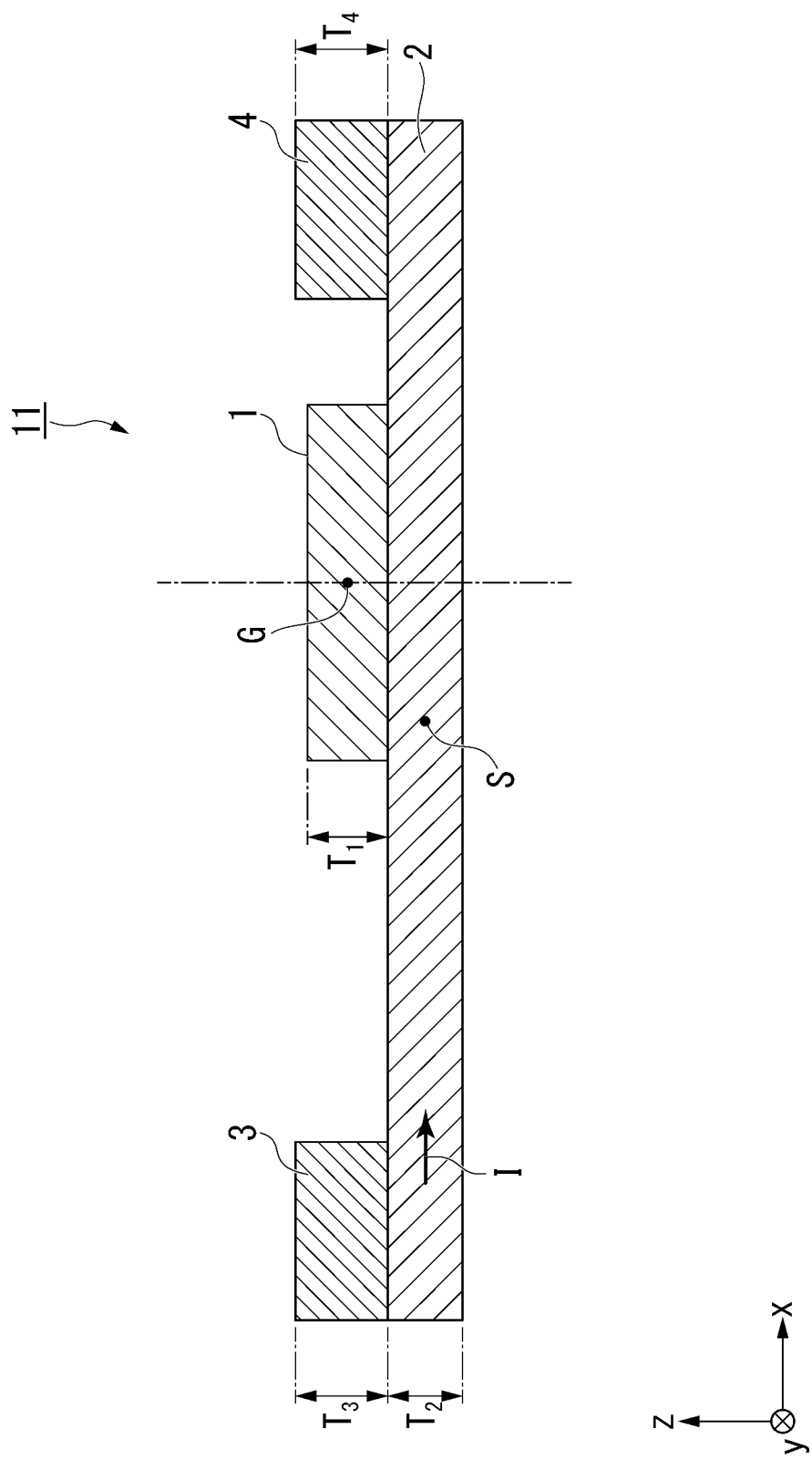
FIG. 3 is a schematic cross-sectional view of another example of the spin-orbit torque type magnetization rotational element according to the first embodiment.

On the other hand, like the spin-orbit torque type magnetization rotational element 11 shown in FIG. 3, the first nonmagnetic metal layer 3 and the second nonmagnetic metal layer 4 may be connected to the first surface facing the first ferromagnetic layer 1 of the spin-orbit torque wiring 2. In the case that the first nonmagnetic metal layer 3 and the second nonmagnetic metal layer 4 are connected to the same plane as the first ferromagnetic layer 1, distances between the first nonmagnetic metal layer 3 or the second nonmagnetic metal layer 4 and the first ferromagnetic layer 1 become closer. For that reason, heat from the first ferromagnetic layer 1 is quickly exhausted due to heat radiation, and thus an unintended magnetization reversal of the first ferromagnetic layer 1 due to heat can be prevented.

In this case, the thicknesses $T_3$ and $T_4$ of the first nonmagnetic metal layer 3 and the second nonmagnetic metal layer 4 are preferably thicker than the thickness $T_1$ of the first ferromagnetic layer. The thickness Ti of the first ferromagnetic layer 1 is preferably 0.5 nm or more and 3.0 nm or less, more preferably 0.7 nm or more and 2.5 nm or less, and further preferably 0.9 nm or more and 2.0 nm or less.

As described above, according to the spin-orbit torque type magnetization rotational elements 10 and 11 according to the present embodiment, an influence of the heat generated by the spin-orbit torque wiring 2 on the first ferromagnetic layer 1 can be reduced. That is, it can be inhibited that a temperature of the first ferromagnetic layer 1 increases thereby lowering a stability of magnetization of the first ferromagnetic layer. The spin-orbit torque type magnetization rotational elements 10 and 11 can be used alone as an anisotropic magnetic sensor and an optical element utilizing a magnetic Kerr effect or a magnetic Faraday effect.

Although an example of the first embodiment has been described in detail above, the first embodiment is not limited to this example, and various modifications and changes can be made within the scope of the gist of the present invention described in the claims.

Figure 4:
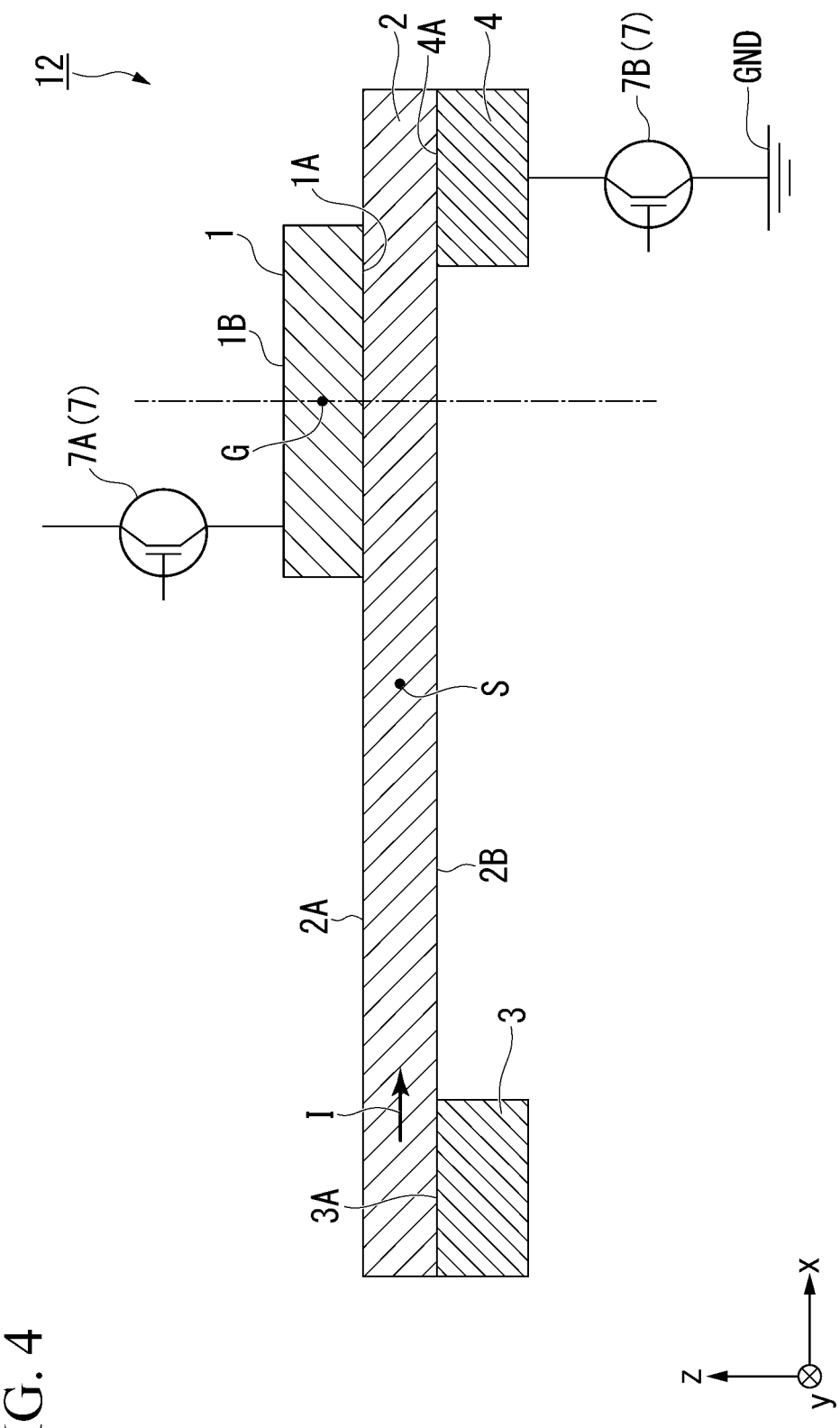
FIG. 4 is a schematic cross-sectional view of another example of the spin-orbit torque type magnetization rotational element according to the first embodiment.

FIG. 4 is a schematic cross-sectional view of another example of the spin-orbit torque type magnetization rotational element according to the first embodiment. The same components as those in FIG. 1 are denoted by the same reference signs, and the description thereof will be omitted.

A portion of the first ferromagnetic layer 1 shown in FIG. 4 overlaps the second nonmagnetic metal layer 4 in a plan view seen in the z direction. The first nonmagnetic metal layer 3 and the second nonmagnetic metal layer 4 have excellent thermal conductivity, and efficiently remove heat from the first ferromagnetic layer 1. By disposing a portion of the first ferromagnetic layer 1 closer to the second nonmagnetic metal layer 4, a stability of magnetization of the first ferromagnetic layer 1 increases.

Further, the spin-orbit torque type magnetization rotational element 12 shown in FIG. 4 has a control unit 7 for flowing a read current. The control unit 7 includes, for example, a first transistor 7A and a second transistor 7B. When the first transistor 7A and the second transistor 7B are turned on, a read current flows in the order of the first ferromagnetic layer 1, the spin-orbit torque wiring 2, and the second nonmagnetic metal layer 4.

A read resistance value is a resistance value between the first ferromagnetic layer 1 and the second nonmagnetic metal layer 4. More specifically, the read resistance value is obtained by adding inherent resistance values of portions through which the read current flows in each of the first ferromagnetic layer 1, the spin-orbit torque wiring 2, and the second nonmagnetic metal layer 4 and an anisotropic magnetoresistance effect of the first ferromagnetic layer 1. In the case of a spin-orbit torque type magnetoresistance effect element which will be described later, a resistance value obtained by adding an inherent resistance value of each layer and a resistance value resulting from a difference in relative angle between the magnetization of the first ferromagnetic layer 1 and the magnetization of the second ferromagnetic layer 6 becomes the read resistance value. When a distance where the read current flows along the spin-orbit torque wiring 2 becomes longer, a portion where the read current flows in the spin-orbit torque wiring 2 becomes larger, and thus the inherent resistance value of the portion becomes larger. When the read resistance value increases, it becomes difficult to read an amount of change in resistance value. On the other hand, when a portion of the first ferromagnetic layer 1 overlaps the second nonmagnetic metal layer 4 and a flowing direction of the read current is controlled, a change in resistance value can be read out sensitively.

Although FIG. 4 shows an example in which the first ferromagnetic layer 1 and the second nonmagnetic metal layer 4 overlap each other, the first ferromagnetic layer 1 and the first nonmagnetic metal layer 3 may overlap each other.

Figure 5:
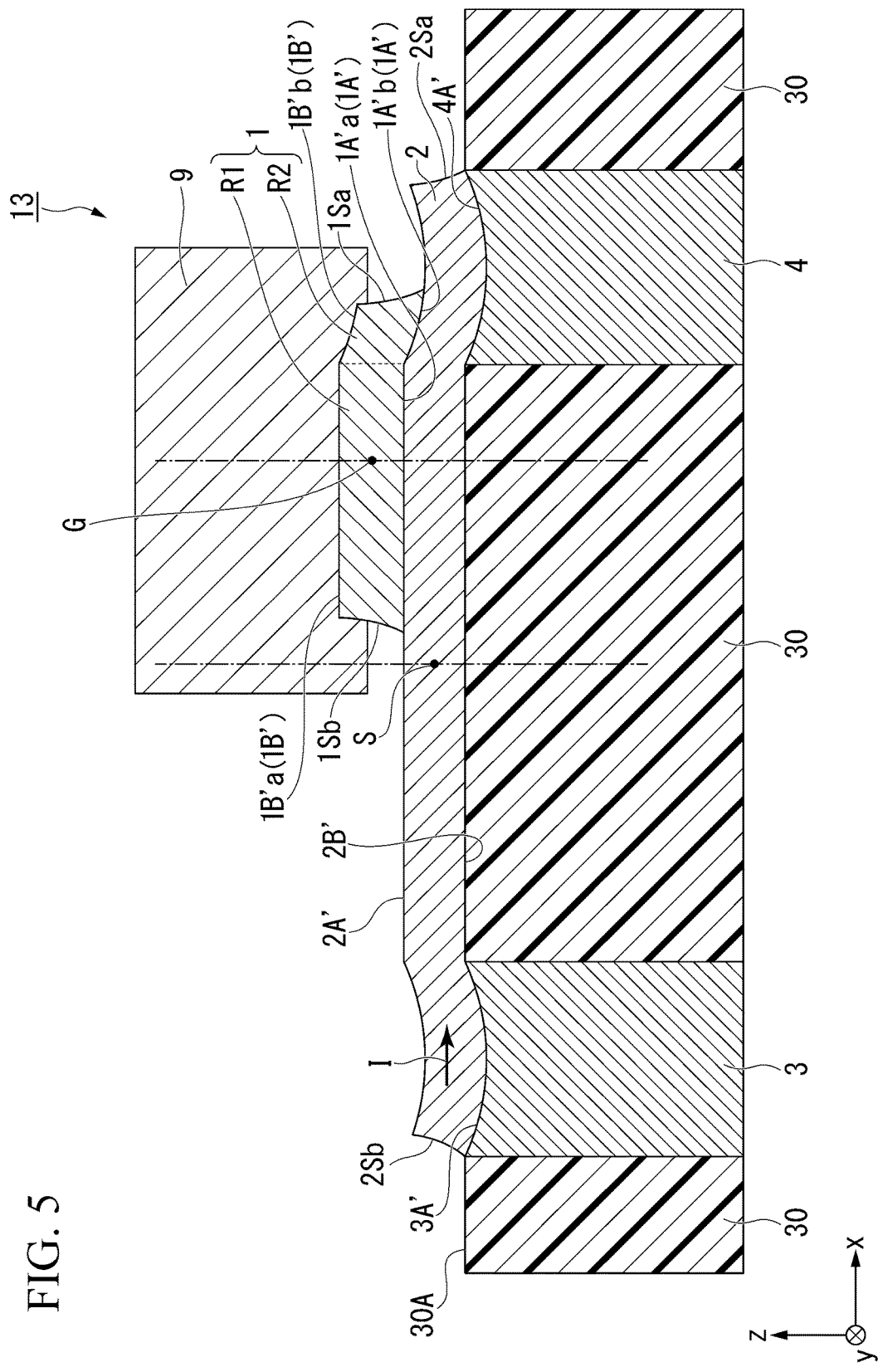
FIG. 5 is a schematic cross-sectional view of another example of the spin-orbit torque type magnetization rotational element according to the first embodiment.
Figure 6:
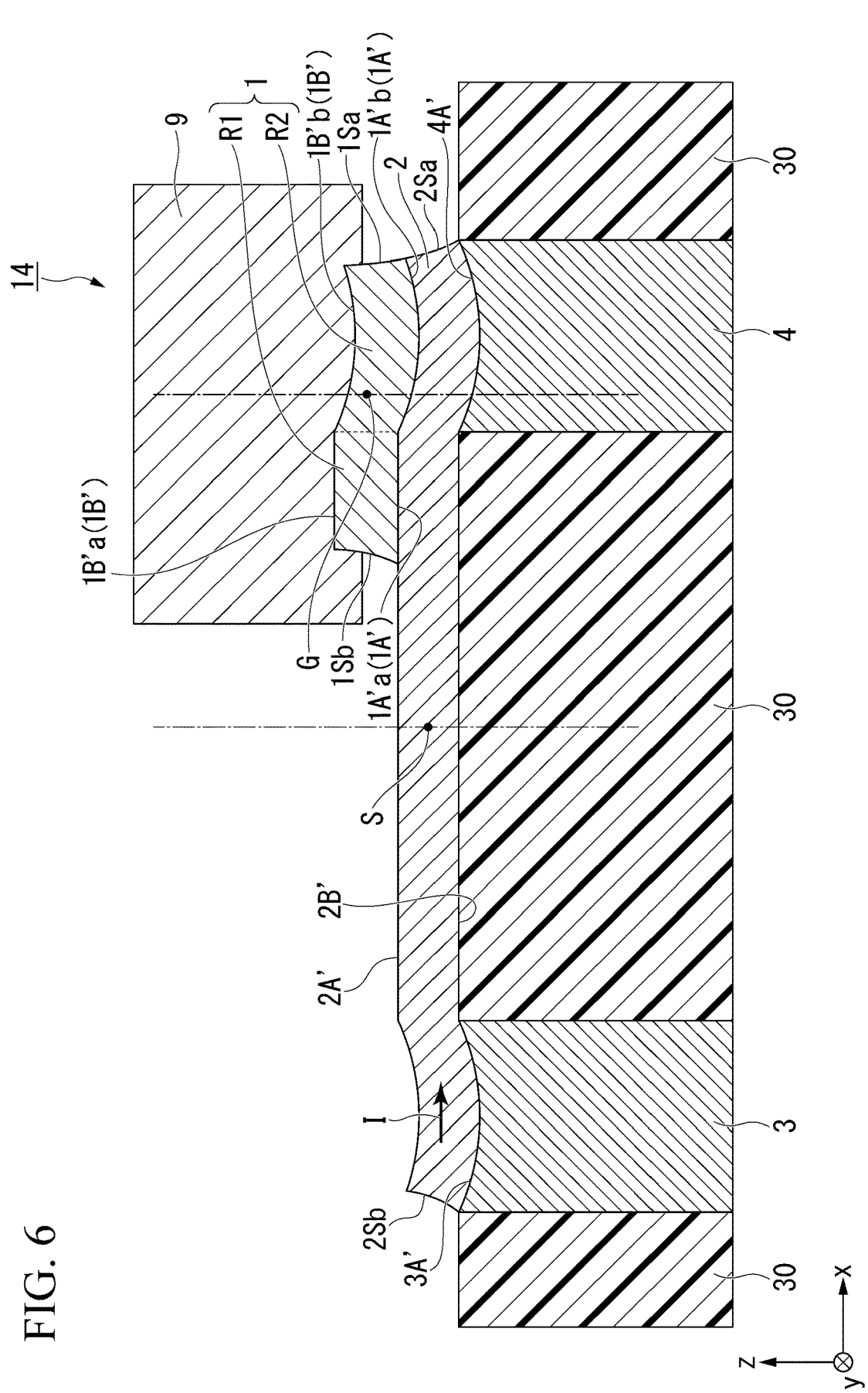
FIG. 6 is a schematic cross-sectional view of another example of the spin-orbit torque type magnetization rotational element according to the first embodiment.

FIGS. 5 and 6 are schematic cross-sectional views of another example of the spin-orbit torque type magnetization rotational element according to the first embodiment. The same components as those in FIG. 1 are denoted by the same reference signs and the description thereof will be omitted. Also, in FIG. 5 and FIG. 6, an insulating layer 30 surrounding the first nonmagnetic metal layer 3 and the second nonmagnetic metal layer 4 and an electrode 9 connected to the first ferromagnetic layer 1 are shown at the same time. The insulating layer 30 is an interlayer insulating film, and is, for example, $SiO_2$ or SiN. The electrode 9 is made of a material having excellent conductivity, and is, for example, Cu. The center of gravity G of the first ferromagnetic layer 1 and the reference point S are at different positions in the x direction.

First surfaces 3A' and 4A' of the first nonmagnetic metal layer 3 and the second nonmagnetic metal layer 4 shown in FIGS. 5 and 6 are recessed with respect to a first surface 30A of the insulating layer 30. Since the insulating layer 30, the first nonmagnetic metal layer 3 and the second nonmagnetic metal layer 4 have different etching rates, the first surfaces 3A' and 4A' may be curved.

The spin-orbit torque wiring 2 is laminated on the first surfaces 30A, 3A', and 4A'. The spin-orbit torque wiring 2 has a first surface 2A', a second surface 2B', a first side surface 2Sa, and a second side surface 2Sb. The first side surface 2Sa and the second side surface 2Sb are inclined with respect to the z direction, for example. The first surface 2A' and the second surface 2B' of the spin-orbit torque wiring 2 reflect shapes of the first surfaces 30A, 3A', and 4A'. The spin-orbit torque wiring 2 has a portion that extends substantially parallel to the x-y plane along the first surface 30A, and a portion that curves with respect to the x-y plane along the first surfaces 3A' and 4A'.

The first ferromagnetic layer 1 is laminated on the first surface 2A' of the spin-orbit torque wiring 2. The third surface 1A' and the fourth surface 1B' of the first ferromagnetic layer 1 reflect a shape of the first surface 2A' of the spin-orbit torque wiring 2.

The first ferromagnetic layer 1 has a first region R1 and a second region R2. The first region R1 is a portion that extends substantially parallel to the x-y plane. The second region R2 is a portion inclined with respect to the x-y plane. The first ferromagnetic layer 1 has a third surface 1A', a fourth surface 1B', a first side surface 1Sa, and a second side surface 1Sb. The first side surface 1Sa and the second side surface 1Sb are inclined with respect to the z direction, for example. The first side surface 1Sa and the second side surface 1Sb are at different positions in the x direction from the first side surface 2Sa and the second side surface 2Sb of the spin-orbit torque wiring 2. For that reason, the first side surface 1Sa and the first side surface 2Sa are discontinuous with each other, and the second side surface 1Sb and the second side surface 2Sb are discontinuous with each other.

The third surface 1A' has a first portion 1A'a and a second portion 1A'b. The first portion 1A'a is the third surface 1A' in the first region R1. The second portion 1A'b is the third surface 1A' in the second region R2. The fourth surface 1B' has a first portion 1B'a and a second portion 1B'b. The first portion 1B'a is the fourth surface 1B' in the first region R1. The second portion 1B'b is the fourth surface 1B' in the second region R2. The first portions 1A'a and 1B'a are flat, and the magnetization is oriented in a predetermined direction. The second portions 1A'b and 1B'b are inclined with respect to the first portions 1A'a and 1B'a, and the magnetization is inclined from a predetermined direction. The magnetization of the second region R2 is easier to rotate than that of the first region R1.

In the spin-orbit torque type magnetization rotational element 13 shown in FIG. 5, the position of the center of gravity G of the first ferromagnetic layer 1 in the x direction and the position of the second nonmagnetic metal layer 4 in the x direction do not overlap each other, and the first region R1 is wider than the second region R2. In the spin-orbit torque type magnetization rotational element 13, the first region R1 ensures stability of magnetization, and the second region R2 facilitates magnetization reversal.

The spin-orbit torque type magnetization rotational element 14 shown in FIG. 6 is different from the spin-orbit torque type magnetization rotational element 13 shown in FIG. 5 in that the position of the center of gravity G of the first ferromagnetic layer 1 in the x direction overlaps the position of the second nonmagnetic metal layer 4 in the x direction. The same components as those in FIG. 5 are denoted by the same reference signs, and the description thereof will be omitted. The first side surface 1Sa of the first ferromagnetic layer 1 and the first side surface 2Sa of the spin-orbit torque type magnetization rotational element 2 are continuous with each other. The term "continuous" means that an inclined surface does not have an inflection point that changes discontinuously. For example, in the XZ plane, the first side surfaces 1Sa and 2Sa can be regarded as continuously changing when an asymptotic line can be drawn with continuous straight lines or curves. The first region R1 is narrower than the second region R2. In the spin-orbit torque type magnetization rotational element 14, the magnetization reversal of the first ferromagnetic layer 1 becomes easier.

Figure 7:
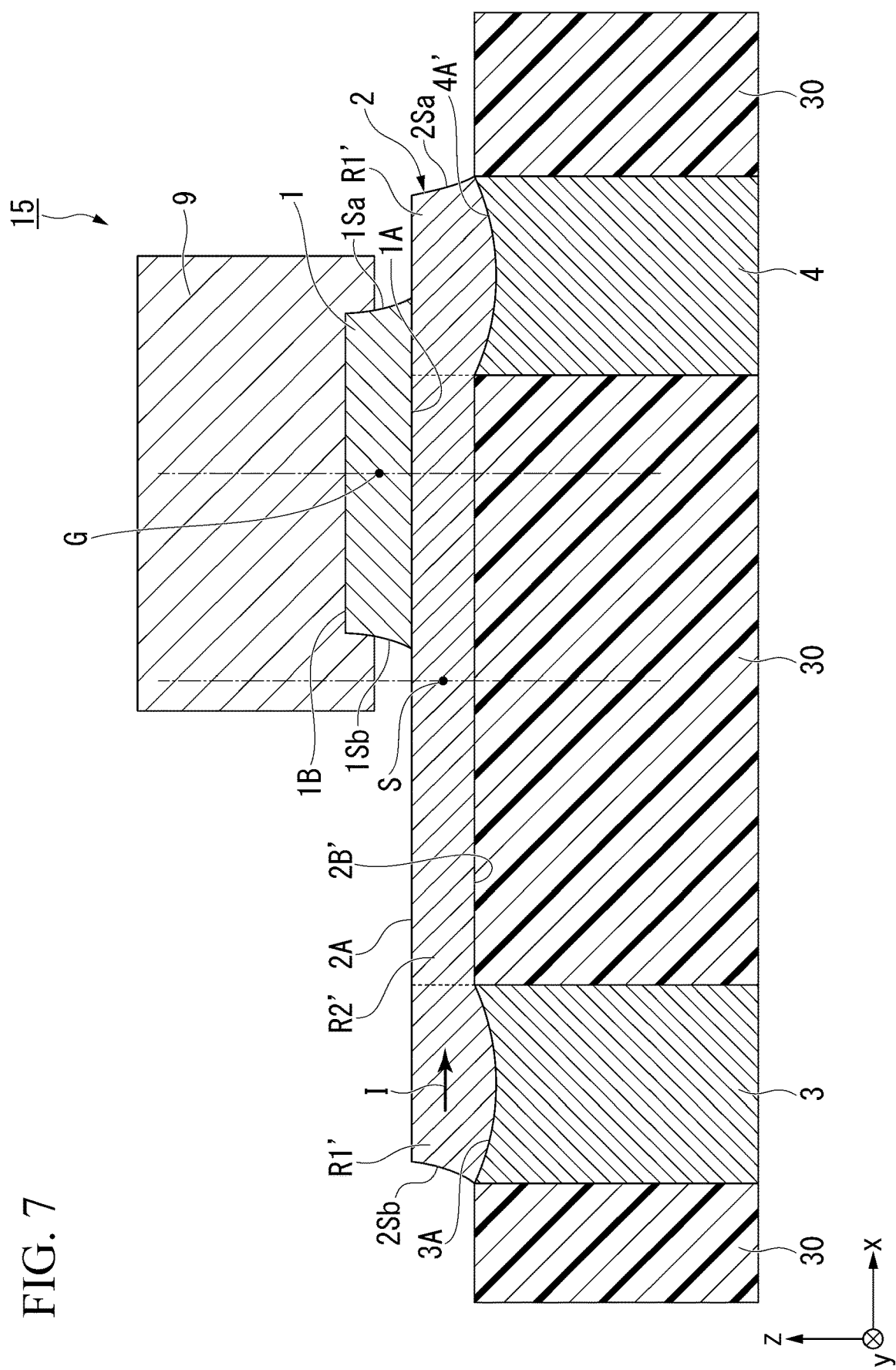
FIG. 7 is a schematic cross-sectional view of another example of the spin-orbit torque type magnetization rotational element according to the first embodiment.

FIG. 7 is a schematic cross-sectional view of another example of the spin-orbit torque type magnetization rotational element according to the first embodiment. The spin-orbit torque type magnetization rotational element 15 shown in FIG. 7 is different from the spin-orbit torque type magnetization rotational element 13 shown in FIG. 5 in that the first surface 2A of the spin-orbit torque wiring 2, the third surface 1A and the fourth surface 1B of the first ferromagnetic layer 1 are flat. The same components as those in FIG. 5 are denoted by the same reference signs, and the description thereof will be omitted. In FIG. 7, the insulating layer 30 and the electrode 9 are shown at the same time.

When the first surface 2A' of the spin-orbit torque type magnetization rotational element 13 shown in FIG. 5 is polished by chemical mechanical polishing (CMP) or the like, the spin-orbit torque type magnetization rotational element 15 shown in FIG. 7 is obtained. When the first surface 2A is flattened, stability of magnetization of the first ferromagnetic layer 1 increases. The spin-orbit torque wiring 2 has a first region R1' and a second region R2'. The first region RI' is a portion overlapping the first nonmagnetic metal layer 3 or the second nonmagnetic metal layer 4 in a plan view seen in the z direction. The second region R2' is another region. The first region R1' is thinner than the second region R2'. The first region R1' is a portion that transfers heat to the first nonmagnetic metal layer 3 or the second nonmagnetic metal layer 4. When the thickness of the first region R1' is thick, heat dissipation is improved. The second region R2' is a portion that supplies spin to the first ferromagnetic layer 1. If the thickness of the second region R2' is thin, the current density of the current flowing through the second region R2' can be increased, and thus the magnetization reversal can be performed efficiently.

Although an example in which the first surfaces 3A' and 4A' of the first nonmagnetic metal layer 3 and the second nonmagnetic metal layer 4 are recessed with respect to the first surface 30A of the insulating layer 30 has been described in FIGS. 5, 6, and 7, the first surfaces 3A' and 4A' of the first nonmagnetic metal layer 3 and the second nonmagnetic metal layer 4 may protrude from the first surface 30A of the insulating layer 30.

Figure 8:
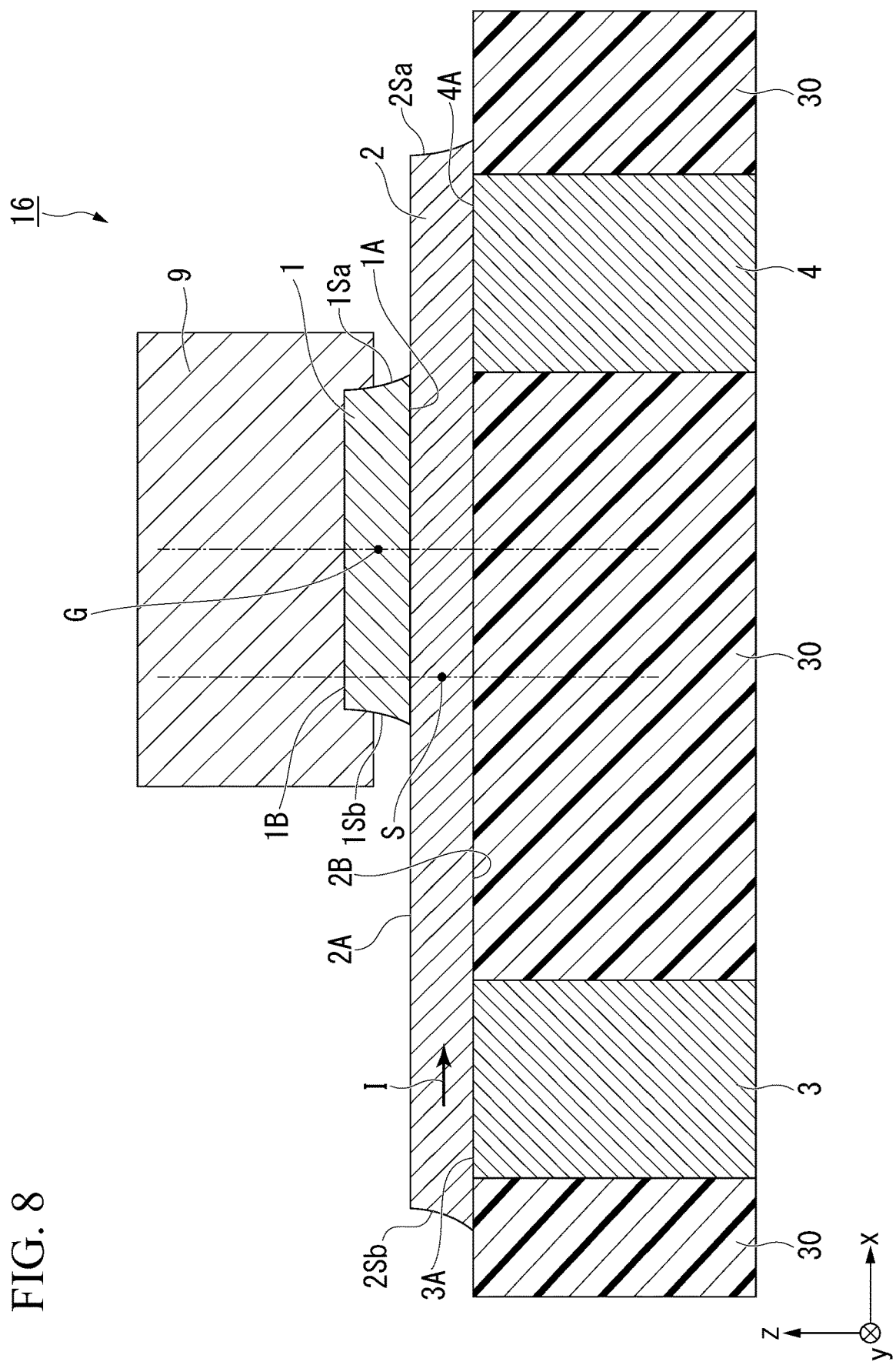
FIG. 8 is a schematic cross-sectional view of another example of the spin-orbit torque type magnetization rotational element according to the first embodiment.
Figure 9:
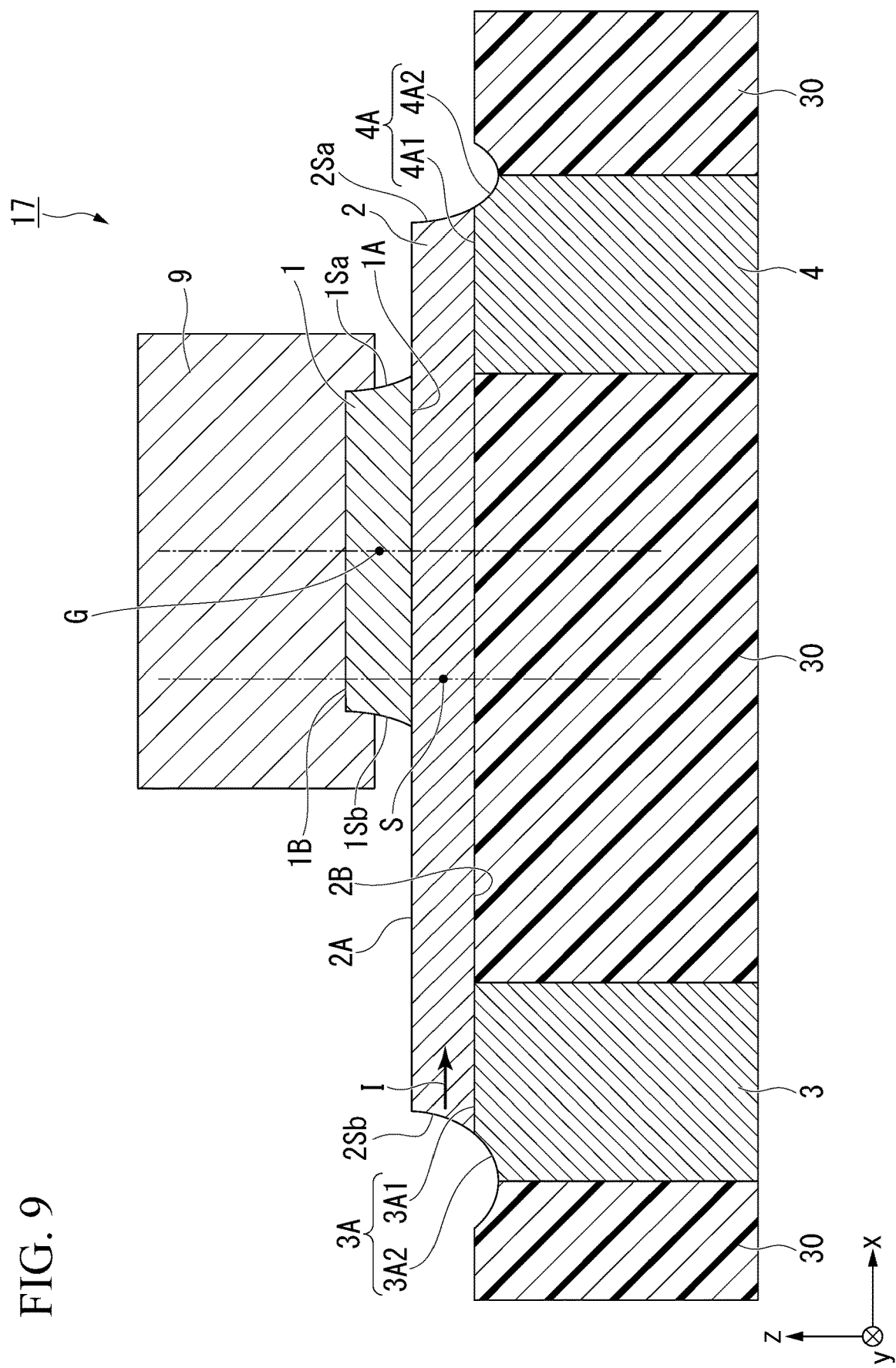
FIG. 9 is a schematic cross-sectional view of another example of the spin-orbit torque type magnetization rotational element according to the first embodiment.

Also, FIGS. 8 and 9 are schematic cross-sectional views of another example of the spin-orbit torque type magnetization rotational element according to the first embodiment. The same components as those in FIG. 1 are denoted by the same reference signs, and the description thereof will be omitted. In addition, in FIGS. 8 and 9, the insulating layer 30 and the electrode 9 are shown at the same time.

The spin-orbit torque wiring 2 of the spin-orbit torque type magnetization rotational element 16 shown in FIG. 8 extends outward in the x direction from the first nonmagnetic metal layer 3 and the second nonmagnetic metal layer 4. The spin-orbit torque wiring 2 is processed into a line after the layers are laminated. By extending the spin-orbit torque wiring 2 in the x direction, a processing margin can be secured.

The spin-orbit torque wiring 2 of the spin-orbit torque type magnetization rotational element 17 shown in FIG. 9 is positioned inside the first nonmagnetic metal layer 3 and the second nonmagnetic metal layer 4 in the x direction. Some portions of the first nonmagnetic metal layer 3 and the second nonmagnetic metal layer 4 are cut away by processing. The first surface 3A of the first nonmagnetic metal layer 3 has a first portion 3A1 and a second portion 3A2. The first portion 3A1 is a portion substantially parallel to the x-y plane. The second portion 3A2 is a portion that inclines discontinuously with respect to the first portion 3A1. The first surface 4A of the second nonmagnetic metal layer 4 has a first portion 4A1 and a second portion 4A2. The first portion 4A1 is a portion substantially parallel to the x-y plane. The second portion 4A2 is a portion that inclines discontinuously with respect to the first portion 4A1. The first side surface 2Sa of the spin-orbit torque wiring 2 is continuous with the second portion 4A2 of the second nonmagnetic metal layer 4. The second side surface 2Sb of the spin-orbit torque wiring 2 is continuous with the second portion 3A2 of the first nonmagnetic metal layer 3.

The spin-orbit torque type magnetization rotational element 17 is often used by integrating a plurality of elements. For example, the first nonmagnetic metal layer 3 or the second nonmagnetic metal layer 4 of the different spin-orbit torque type magnetization rotational element 17 may be adjacent to the second nonmagnetic metal layer 4 side. By cutting out some portions of the first nonmagnetic metal layer 3 and the second nonmagnetic metal layer 4, the influence of the electric field generated around the first nonmagnetic metal layer 3 and the second nonmagnetic metal layer 4 can be reduced. As a result, the distance between adjacent spin-orbit torque type magnetization rotational elements 17 can be reduced, and thus a degree of integration of the spin-orbit torque type magnetization rotational elements 17 can be increased.

Also, the respective modifications shown in FIGS. 4 to 9 can be combined with each other. For example, in the modification shown in FIGS. 4 to 7, the first side surface 2Sa of the spin-orbit torque wiring 2 may be positioned outside the first nonmagnetic metal layer 3 or positioned inside it. The same applies to the second side surface 2Sb and the second nonmagnetic metal layer 4.

Second Embodiment (Spin-Orbit Torque Type Magnetoresistance Effect Element)

Figure 10:
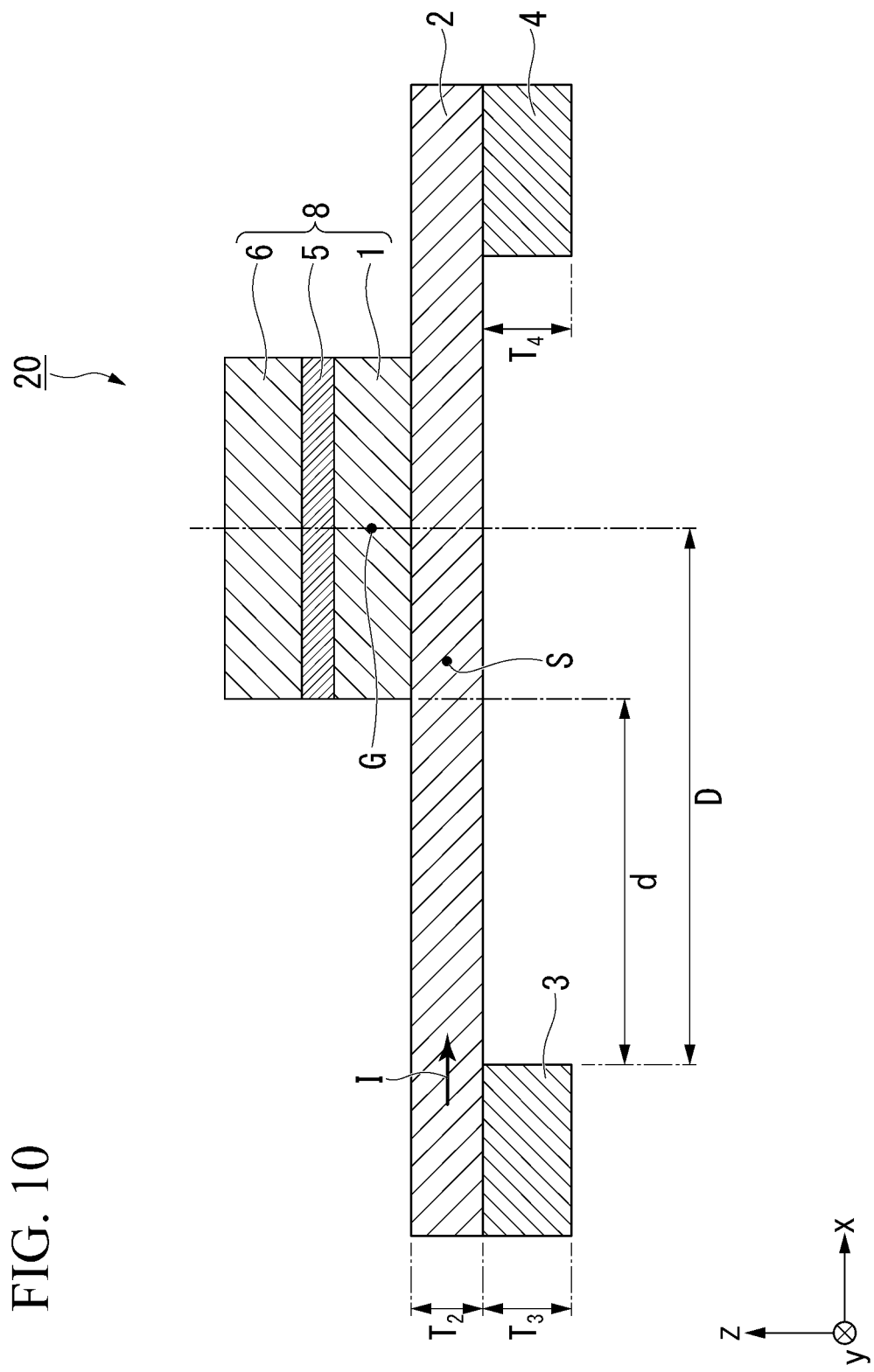
FIG. 10 is a schematic cross-sectional view of a spin-orbit torque type magnetoresistance effect element according to a second embodiment.

FIG. 10 is a schematic cross-sectional view of a spin-orbit torque type magnetoresistance effect element 20 according to a second embodiment. The spin-orbit torque type magnetoresistance effect element 20 shown in FIG. 10 includes a first ferromagnetic layer 1, a spin-orbit torque wiring 2, a first nonmagnetic metal layer 3, a second nonmagnetic metal layer 4, a nonmagnetic layer 5, and a second ferromagnetic layer 6. The first ferromagnetic layer 1, the spin-orbit torque wiring 2, the first nonmagnetic metal layer 3 and the second nonmagnetic metal layer 4 correspond to those in the spin-orbit torque type magnetization rotational element 10 according to the first embodiment shown in FIG. 1. Descriptions of constituents equivalent to those of the spin-orbit torque type magnetization rotational element 10 of the first embodiment will be omitted.

A laminate (a functional unit 8) in which the first ferromagnetic layer 1, the nonmagnetic layer 5, and the second ferromagnetic layer 6 are laminated functions in the same manner as a normal magnetoresistance effect element. The functional unit 8 functions when the magnetization of the second ferromagnetic layer 6 is fixed in one direction (z direction) and the magnetization direction of the first ferromagnetic layer 1 changes relatively. In the case of being applied to a coercive force difference type (a pseudo spin valve type) MRAM, a coercive force of the second ferromagnetic layer 6 is made larger than a coercive force of the first ferromagnetic layer 1. In the case of being applied to an exchange bias type (spin valve type) MRAM, the magnetization of the second ferromagnetic layer is fixed by exchange coupling with an antiferromagnetic layer.

In the case in which the nonmagnetic layer 5 is made of an insulator, the functional unit 8 has the same configuration as that of a tunneling magnetoresistance (TMR) effect element, and in the case of being made of metal, it has the same configuration as that of a giant magnetoresistance (GMR) effect element.

The laminated structure of the functional unit 8 can employ a laminated structure of known magnetoresistance effect elements. For example, each layer may be configured of a plurality of layers, or may be provided with other layers such as an antiferromagnetic layer for fixing a magnetization direction of the second ferromagnetic layer 6. The second ferromagnetic layer 6 is called a fixed layer or a reference layer, and the first ferromagnetic layer 1 is called a free layer or a storage layer.

As the material of the second ferromagnetic layer 6, the same material as that of the first ferromagnetic layer 1 can be used. In order to further increase the coercive force of the second ferromagnetic layer 6 with respect to the first ferromagnetic layer 1, an antiferromagnetic material such as IrMn or PtMn may be used as a material in contact with the second ferromagnetic layer 6. Further, in order to prevent a leakage of a magnetic field of the second ferromagnetic layer 6 from affecting the first ferromagnetic layer 1, a synthetic ferromagnetic coupling structure may be used.

A known material can be used for the nonmagnetic layer 5.

For example, in the case in which the nonmagnetic layer 5 is made of an insulator (when it is a tunnel barrier layer), $Al_2O_3$, $SiO_2$, MgO, $MgAl_2O_4$, or the like can be used as the material thereof. In addition to these, a material in which a part of Al, Si, Mg is substituted with Zn, Be, or the like can also be used as the nonmagnetic layer 5. Among the above, MgO and $MgAl_2O_4$ are materials that can realize a coherent tunnel. In the case in which the nonmagnetic layer 5 is made of a metal, Cu, Au, Ag, or the like can be used as the material thereof. Further, in the case in which the nonmagnetic layer 5 is made of a semiconductor, Si, Ge, $CuInSe_2$, $CuGaSe_2$, $Cu(In, Ga)Se_2$, or the like can be used as the material thereof.

The functional unit 8 may have other layers. An underlayer may be provided on the surface of the first ferromagnetic layer 1 opposite to the nonmagnetic layer 5. It is preferable that the layer disposed between the spin-orbit torque wiring 2 and the first ferromagnetic layer 1 not dissipate the spin propagating from the spin-orbit torque wiring 2.

For example, it is known that silver, copper, magnesium, aluminum, and the like have a long spin diffusion length of 100 nm or more and are difficult to dissipate spin. The thickness of this layer is preferably less than or equal to a spin diffusion length of the material constituting the layer. If the thickness of the layer is less than or equal to the spin diffusion length, the spin propagating from the spin-orbit torque wiring 2 can be sufficiently transmitted to the first ferromagnetic layer 1.

Also in the spin-orbit torque type magnetoresistance effect element according to the second embodiment, the position of the center G of the first ferromagnetic layer 1 and the reference point S in the x direction deviate from each other. Therefore, the influence of the heat generated by the spin-orbit torque wiring 2 on the first ferromagnetic layer 1 is reduced, and thus the stability of magnetization of the first ferromagnetic layer 1 increases. That is, the spin-orbit torque type magnetoresistance effect element according to the second embodiment has a low writing error rate.

Third Embodiment (Magnetic Memory)

Figure 11:
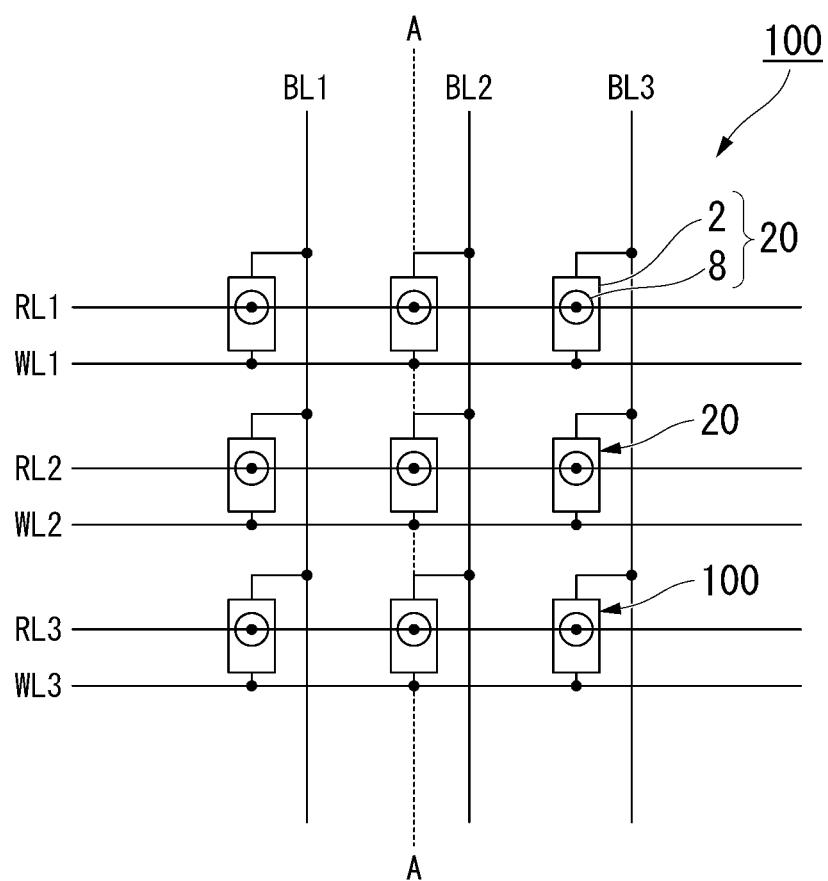
FIG. 11 is a schematic diagram of a magnetic memory according to a third embodiment including a plurality of spin-orbit torque magnetoresistance effect elements.

FIG. 11 is a schematic diagram of a magnetic memory 100 including a plurality of spin-orbit torque type magnetoresistance effect elements 20 (see FIG. 10). FIG. 10 corresponds to a cross-sectional view of the spin-orbit torque type magnetoresistance effect element 20 taken along plane A-A of FIG. 11. In the magnetic memory 100 shown in FIG. 11, the spin-orbit torque type magnetoresistance effect elements 20 are arranged in a 3×3 matrix. FIG. 11 shows an example of a magnetic memory, and the number and arrangement of the spin-orbit torque type magnetoresistance effect elements 20 are arbitrary.

The spin-orbit torque type magnetoresistance effect elements 20 are connected to one word line WL1 to WL3, one bit line BL1 to BL3, and one read line RL1 to RL3, respectively.

By selecting the word lines WL1 to WL3 and bit lines BL1 to BL3 to which current is applied, the current passes through the spin-orbit torque wiring 2 of the arbitrary spin-orbit torque type magnetoresistance effect element 20 to perform a writing operation. Further, by selecting the read lines RL1 to RL3 and the bit lines BL1 to BL3 to which current is applied, the current passes in the laminating direction of the functional unit 8 of the arbitrary spin-orbit torque type magnetoresistance effect element 20 to perform a reading operation. The word lines WL1 to WL3, the bit lines BL1 to BL3, and the read lines RL1 to RL3 to which current is applied can be selected by transistors or the like. In other words, the data of an arbitrary element can be read from the plurality of spin-orbit torque type magnetoresistance effect elements 20 to be used as a magnetic memory.

Although the preferred embodiments of the present invention have been described in detail above, it should be understood that the present invention is not limited to specific embodiments, and various modifications and changes are possible within the scope of the gist of the present invention described in the claims.

REFERENCE SIGNS LIST

1 First ferromagnetic layer
1a End portion
1A, 2A, 3A, 4A, 1A', 2A', 3A', 4A' Third surface
1B, 2B, 1B', 2B' Fourth surface
2 Spin-orbit torque wiring
3 First nonmagnetic metal layer
3a First end portion
4 Second nonmagnetic metal layer
5 Nonmagnetic layer
6 Second ferromagnetic layer
8 Functional unit
10 Spin-orbit torque type magnetization rotational element
20 Spin-orbit torque type magnetoresistance effect element
100 Magnetic memory
G Center of gravity
S Reference point

What is claimed is:

1. A spin-orbit torque type magnetization rotational element comprising:
    a spin-orbit torque wiring extending in a first direction;
    a first ferromagnetic layer laminated with the spin-orbit torque wiring in a second direction intersecting the first direction; and
    a first nonmagnetic metal layer and a second nonmagnetic metal layer which are connected to the spin-orbit torque wiring at positions sandwiching the first ferromagnetic layer in the first direction in a plan view seen in the second direction,
    wherein, in the first direction, a center of gravity of the first ferromagnetic layer is positioned at a position deviating toward either a first nonmagnetic metal layer side or a second nonmagnetic metal layer side from a reference point that is a center between the first nonmagnetic metal layer and the second nonmagnetic metal layer.

2. The spin-orbit torque type magnetization rotational element according to claim 1,
    wherein the center of gravity is positioned at a position deviating toward the second nonmagnetic metal layer side from the reference point, and
    the second nonmagnetic metal layer is positioned downstream when a current is applied to the spin-orbit torque wiring.

3. The spin-orbit torque type magnetization rotational element according to claim 1, wherein a portion of the first ferromagnetic layer overlaps the reference point in a plan view seen in the second direction.

4. The spin-orbit torque type magnetization rotational element according to claim 1,
wherein the first nonmagnetic metal layer is positioned upstream when a current is applied to the spin-orbit torque wiring and has a first end portion on a first ferromagnetic layer side, and
a distance D in the first direction between the first end portion and the center of gravity and a thickness $T_2$ of the spin-orbit torque wiring satisfy the relationship of $6 \leq D/T_2 \leq 56$.

5. The spin-orbit torque type magnetization rotational element according to claim 1, wherein widths of the first nonmagnetic metal layer and the second nonmagnetic metal layer are wider than a width of the first ferromagnetic layer.

6. The spin-orbit torque type magnetization rotational element according to claim 1,
wherein thicknesses of the first nonmagnetic metal layer and the second nonmagnetic metal layer are thicker than a thickness of the spin-orbit torque wiring, and
widths of the first nonmagnetic metal layer and the second nonmagnetic metal layer are wider than a width of the spin-orbit torque wiring.

7. The spin-orbit torque type magnetization rotational element according to claim 1, wherein the first nonmagnetic metal layer and the second nonmagnetic metal layer include any one of a group consisting of Ag, Au, Cu, Al, W, Co, Ni, Zn, Ta, TiN, and TaN.

8. The spin-orbit torque type magnetization rotational element according to claim 1, wherein the first nonmagnetic metal layer and the second nonmagnetic metal layer are connected to a second surface on a side opposite to a first surface facing the first ferromagnetic layer of the spin-orbit torque wiring.

9. The spin-orbit torque type magnetization rotational element according to claim 1, wherein the first nonmagnetic metal layer and the second nonmagnetic metal layer are connected to a first surface facing the first ferromagnetic layer of the spin-orbit torque wiring.

10. The spin-orbit torque type magnetization rotational element according to claim 1, wherein the first nonmagnetic metal layer and the second nonmagnetic metal layer are connected to the spin-orbit torque wiring without an intervening oxide.

11. The spin-orbit torque type magnetization rotational element according to claim 1, wherein a portion of the first ferromagnetic layer overlaps the first nonmagnetic metal layer or the second nonmagnetic metal layer in a plan view seen in the second direction.

12. The spin-orbit torque type magnetization rotational element according to claim 11, further comprising a control unit, which allows a read current to flow between the first ferromagnetic layer and one of the first nonmagnetic metal layer and the second nonmagnetic metal layer overlapping the portion of the first ferromagnetic layer in a plan view seen in the second direction.

13. A spin-orbit torque magnetoresistance effect element comprising:
a spin-orbit torque type magnetization rotational element according to claim 1;
a nonmagnetic layer which faces a fourth surface on a side opposite to a third surface facing the spin-orbit torque wiring in the first ferromagnetic layer; and
a second ferromagnetic layer sandwiching the nonmagnetic layer together with the first ferromagnetic layer.

14. A magnetic memory comprising a plurality of spin-orbit torque type magnetoresistance effect elements according to claim 13.

15. The spin-orbit torque type magnetization rotational element according to claim 1, wherein the second direction is perpendicular to the first direction.

* * * * *